(12) United States Patent
Kim et al.

(10) Patent No.: US 7,629,822 B2
(45) Date of Patent: *Dec. 8, 2009

(54) DELAY LOCKED LOOP IN SEMICONDUCTOR MEMORY DEVICE AND METHOD FOR GENERATING DIVIDED CLOCK THEREIN

(75) Inventors: Kyoung-Nam Kim, Ichon-shi (KR); Tae-Yun Kim, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/078,095

(22) Filed: Mar. 27, 2008

(65) Prior Publication Data
US 2008/0211553 A1    Sep. 4, 2008

Related U.S. Application Data

(63) Continuation of application No. 11/320,847, filed on Dec. 30, 2005, now Pat. No. 7,368,964.

(30) Foreign Application Priority Data
Jan. 31, 2005    (KR)    ............ 2005-0008447

(51) Int. Cl.
*H03L 7/06* (2006.01)
(52) U.S. Cl. .................. 327/158; 327/159
(58) Field of Classification Search .......... 327/155, 327/158, 159, 161; 331/40, 41
See application file for complete search history.

(56) References Cited

U.S. PATENT DOCUMENTS

| | | | |
|---|---|---|---|
| 5,771,264 A * | 6/1998 | Lane | ............ 375/376 |
| 6,011,732 A | 1/2000 | Harrison et al. | |
| 6,539,072 B1 | 3/2003 | Donnelly et al. | |
| 6,768,690 B2 | 7/2004 | Kwon et al. | |
| 6,819,603 B2 | 11/2004 | Jones et al. | |
| 7,076,013 B2 * | 7/2006 | Cho | ............ 375/354 |
| 7,148,764 B2 * | 12/2006 | Kasahara et al. | ............ 331/179 |

FOREIGN PATENT DOCUMENTS

| | | |
|---|---|---|
| JP | 2003-132680 | 5/2003 |
| JP | 2003-272379 | 9/2003 |
| KR | 10-2004-0001434 | 1/2004 |
| KR | 2004-0001434 A | 1/2004 |
| KR | 2004-0046325 A | 6/2004 |

* cited by examiner

*Primary Examiner*—An T Luu
(74) *Attorney, Agent, or Firm*—IP & T Law Firm PLC

(57) ABSTRACT

Provided are a delay locked loop (DLL) and a method for generating a divided clock therein. In the DLL, a width of a reference frequency for phase comparison can be changed depending on a magnitude of an operating frequency. In the DLL, a clock buffer receives a clock equal to an external clock and generates an internal clock. An enable clock generator generates a 1-period enable clock or a 2-period enable clock using a command signal generated for performing a predefined operation. The command signal is generated according to an address command signal inputted from an exterior. A clock divider divides the internal clock to generate a divided clock. The divided clock is controlled by the 1-period enable clock or the 2-period enable clock, such that the divided clock is made to be a 1-period based dividing clock or a 2-period based dividing clock.

19 Claims, 6 Drawing Sheets locking

DELAY LOCKED LOOP IN SEMICONDUCTOR MEMORY DEVICE AND METHOD FOR GENERATING DIVIDED CLOCK THEREIN

RELATED APPLICATIONS

This application is a Continuation of U.S. application Ser. No. 11/320,847, filed Dec. 30, 2005, now U.S. Pat. No. 7,368,964, claiming priority of Korean Application No. 2005-0008447, filed Jan. 31, 2005, the entire contents of each of which are hereby incorporated by reference.

FIELD OF THE INVENTION

The present invention relates to a semiconductor memory device; and, more particularly, to a delay locked loop capable of changing a width of a reference frequency for phase comparison depending on a magnitude of an operating frequency, and a method for generating a divided clock therein.

DESCRIPTION OF RELATED ART

In a system or circuit, a clock is used as a reference for synchronization of an operating timing and is also used for securing a rapid operation without errors. When an external clock is used within the system or circuit, a clock skew occurs in an internal circuit. A delay locked loop (DLL) is used to compensate for the clock skew and synchronize the internal clock with the external clock. That is, a timing in which data sensed using the external clock is outputted through a data output buffer is matched with a timing in which the external clock is inputted.

A case where the DLL is applied to a DDR SDRAM will be taken as an example.

FIG. 1 is a block diagram of a conventional register controlled DLL of a DDR SDRAM.

Referring to FIG. 1, the conventional register controlled DLL includes an input buffer 1, a clock buffer 10, a clock divider 2, a phase comparator 3, a delay controller 4, a delay line 5, a dummy delay line 6, and a replica model 7.

The input buffer 1 receives an external clock eclk and an inverted external clock eclkb to generate a first internal clock fclk and a second internal clock rclk, which are synchronized with a falling edge and a rising edge of an external clock clk, respectively.

The clock buffer 10 receives a clock equal to the external clock clk to generate a clock equal to the second internal clock rclk.

The clock divider 2 divides the clock from the clock buffer 10 by n (where n is positive integers, generally n=8) and generates a reference clock ref_clk.

The phase comparator 3 compares a rising edge of a feedback clock fb_clk from the replica model 7 with a rising edge of the reference cock ref_clk.

The delay controller 7 including a shift register controls a delay amount by shifting a phase of a clock passing through the delay line 5 and the dummy delay line 6 in response to a control signal outputted from the phase comparator 3.

The delay model 7 is configured to have a delay time equal to a delay time occurring in a real clock path.

Meanwhile, the phase comparator 3 compares a phase of the divided reference clock ref_clk from the clock divider 2 with a phase of the feedback clock fb_clk from the replica model 7. As shown in FIG. 2, if the rising edge of the feedback clock fb_clk leads the rising edge of the reference clock ref_clk, the phase of the clock passing through the delay line 5 and the dummy delay line is delayed by a predetermined time, so that the DLL is set to a locking state.

However, due to the increase of the operating frequency, the conventional DLL has an operational limitation. That is, if the operating frequency increases, the period is shortened by one period (tCK). Thus, it may be shortened by one period (tCK) compared with a delay time (tD) of the replica model 7 inevitably occurring in an initial operation of the DLL. Specifically, as shown in FIG. 3, if the rising edge of the feedback clock lags behind the rising edge of the reference clock, the DLL decreases the phase delay of the feedback clock, such that the phase of the internal clock is locked. However, in the current state, the phase of the clock passing through the delay line is delayed to the minimum. Therefore, the phase delay cannot be reduced any more. Consequently, if one period (tCK) of the operating frequency is larger than the delay time (tD) of the replica model 7, the conventional DLL cannot lock the phase of the internal clock to the external clock.

To solve this problem, a clock divider in a DLL and a method for dividing a clock are disclosed in Korean Patent Application No. 10-2002-36634, filed on Jun. 28, 2002 by the present applicant, and Korean Patent Laid-Open Publication No. 10-2004-1434, published on Jan. 7, 2004 by the present invention.

However, the conventional DLL must include a low frequency division clock generator, a select signal generator, and a division clock selector. In addition, a circuit for generating a long locking signal must be included separately. Here, a logic state of the long locking signal is changed when a delay amount of a delay circuit and a delay amount of a delay model exceed one period of an external clock. Consequently, there is a problem in that a layout of the DLL increases.

SUMMARY OF THE INVENTION

It is, therefore, an object of the present invention to provide a delay locked loop capable of changing a width of a reference frequency for phase comparison depending on a magnitude of an operating frequency, and a method for generating a divided clock therein.

In accordance with an aspect of the present invention, there is provided a DLL including: a clock buffer for receiving a clock equal to an external clock and generating an internal clock; an enable clock generator for generating a 1-period enable clock or a 2-period enable clock using a command signal generated for performing a predefined operation, the command signal being generated according to an address command signal inputted from an exterior; and a clock divider for dividing the internal clock to generate a divided clock, the divided clock being controlled by the 1-period enable clock or the 2-period enable clock, such that the divided clock is made to be a 1-period based dividing clock or a 2-period based dividing clock.

The enable clock generator may include: a 1-period enable clock generating unit for logically combining a first group of CAS latency command signals to generate the 1-period enable clock; and a 2-period enable clock generating unit for logically combining a second group of CAS latency command signals to generate the 2-period enable clock, the second group of the CAS latency command signals having a value greater than the first group of the CAS latency command signals.

If a first test mode signal is inputted, the 1-period enable clock generating unit operates without regard to the first group of the CAS latency command signals.

If a second test mode signal is inputted, the 2-period enable clock generating unit operates without regard to the second group of the CAS latency command signals.

The 1-period enable clock generating unit may include: a first NOR gate configured to receive the first group of the CAS latency command signals; a second NOR gate configured to receive an output of the first NOR gate and the first test mode signal; a third NOR gate configured to receive an output of the second NOR gate and the first test mode signal; and an inverter configured to invert an output of the third NOR gate.

The 2-period enable clock generating unit may include: a first NOR gate configured to receive the second group of the CAS latency command signals; a second NOR gate configured to receive an output of the first NOR gate and the second test mode signal; a third NOR gate configured to receive an output of the second NOR gate and the second test mode signal; and an inverter configured to invert an output of the third NOR gate.

The clock divider may include: a first division unit for dividing the internal clock outputted from the clock buffer to generate a 2-division clock; a second division unit for outputting a 1-period based dividing clock and a 2-period based dividing clock using the 2-division clock; and a clock selection unit for outputting the 1-period based dividing clock if the 1-period enable clock is enabled, and outputting the 2-period based dividing clock if the 2-period based dividing clock is enabled.

The first division unit receives a clock having the same period as the external clock and generates the 1-period based dividing clock that maintains a first logic state during a period corresponding to one period of the external clock and maintains a second logic state during the remaining period.

The second division unit receives a clock having the same period as the external clock and generates the 2-period based dividing clock that maintains a first logic state during a period corresponding to two periods of the external clock and maintains a second logic state during the remaining period.

In accordance with another aspect of the present invention, there is provided a method for generating a divided clock in a delay locked loop (DLL), including the steps of: a) receiving a clock equal to an external clock to generate an internal clock; b) generating a 1-period enable clock or a 2-period enable clock using a command signal generated for performing a predefined operation, the command signal being generated according to an address command signal inputted from an exterior; and c) dividing the internal clock to generate a divided clock, the divided clock being controlled by the 1-period enable clock or the 2-period enable clock, such that the divided clock is made to be a 1-period based dividing clock or a 2-period based dividing clock.

The step a) may include the steps of: logically combining a first group of CAS latency command signals to generate the 1-period enable clock; and logically combining a second group of CAS latency command signals to generate the 2-period enable clock, the second group of the CAS latency command signals having a value greater than the first group of the CAS latency command signals.

The step c) may include the steps of: dividing the internal clock to generate a 2-division clock; outputting a 1-period based dividing clock and a 2-period based dividing clock using the 2-division clock; and outputting the 1-period based dividing clock if the 1-period enable clock is enabled, and outputting the 2-period based dividing clock if the 2-period based dividing clock is enabled.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
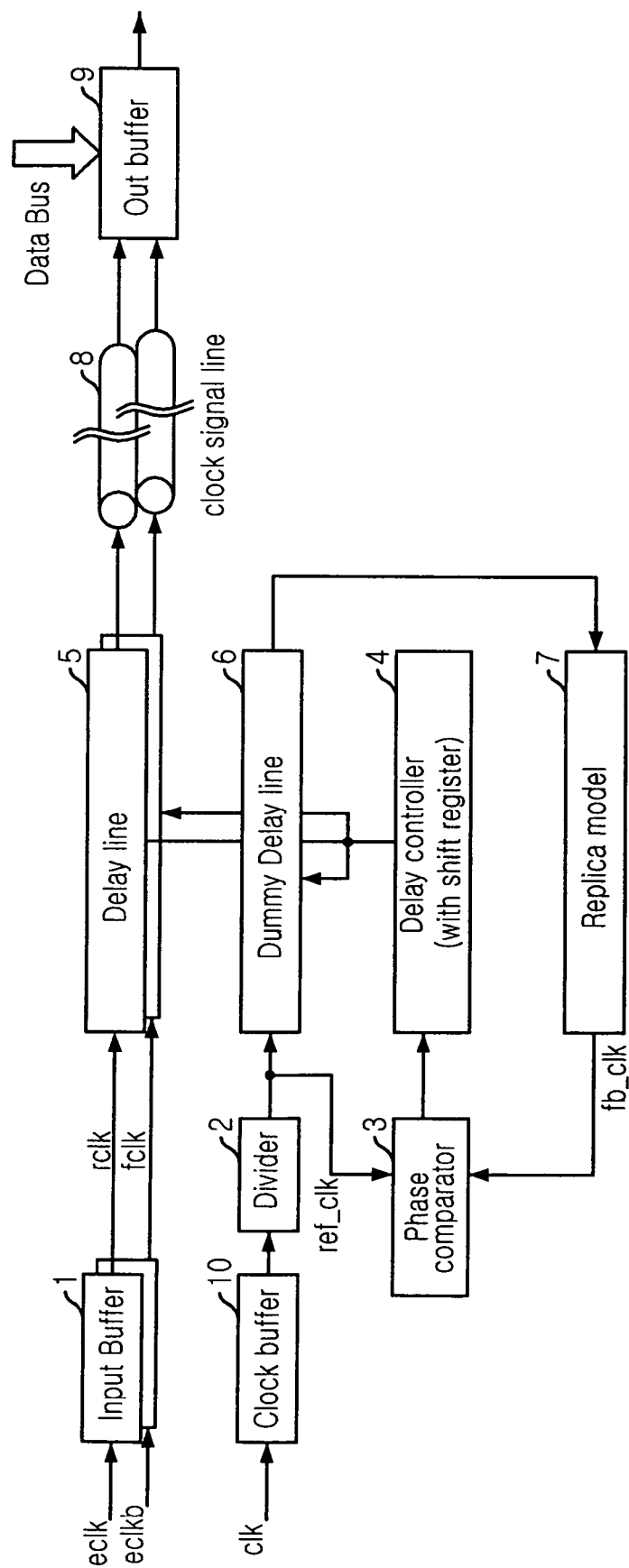
FIG. 1 is a block diagram of a conventional register controlled DLL of a DDR SDRAM.
Figure 2:
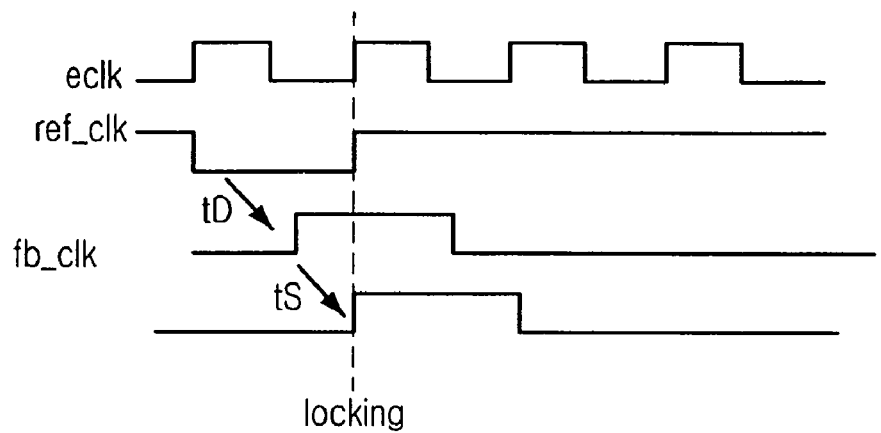
FIG. 2 is a waveform of a conventional clock locking.
Figure 4:
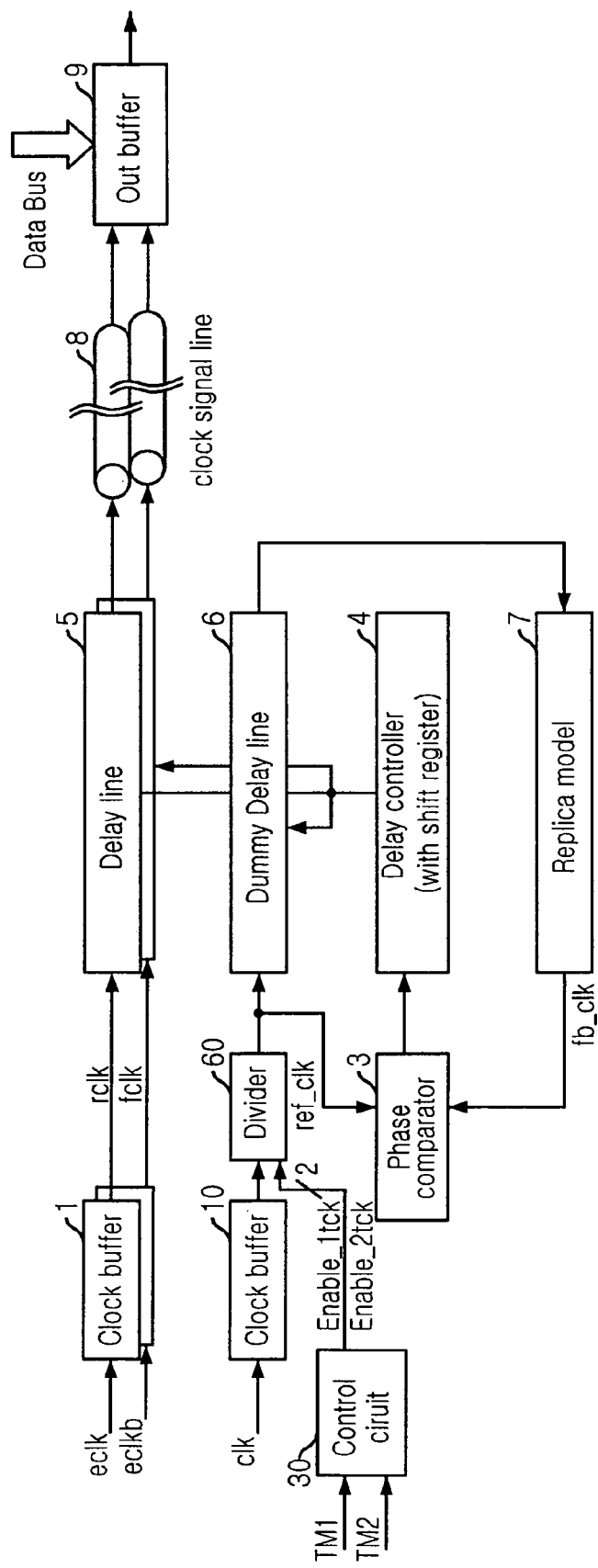
FIG. 4 is a block diagram of a DLL in accordance with an embodiment of the present invention.

FIG. 4 is a block diagram of a DLL in accordance with an embodiment of the present invention. Since the configuration of the DLL shown in FIG. 4 is similar to that shown in FIG. 1, a detailed description thereof will be omitted. A following description will be focused on a clock divider 2 and signals applied thereto.

Figure 5:
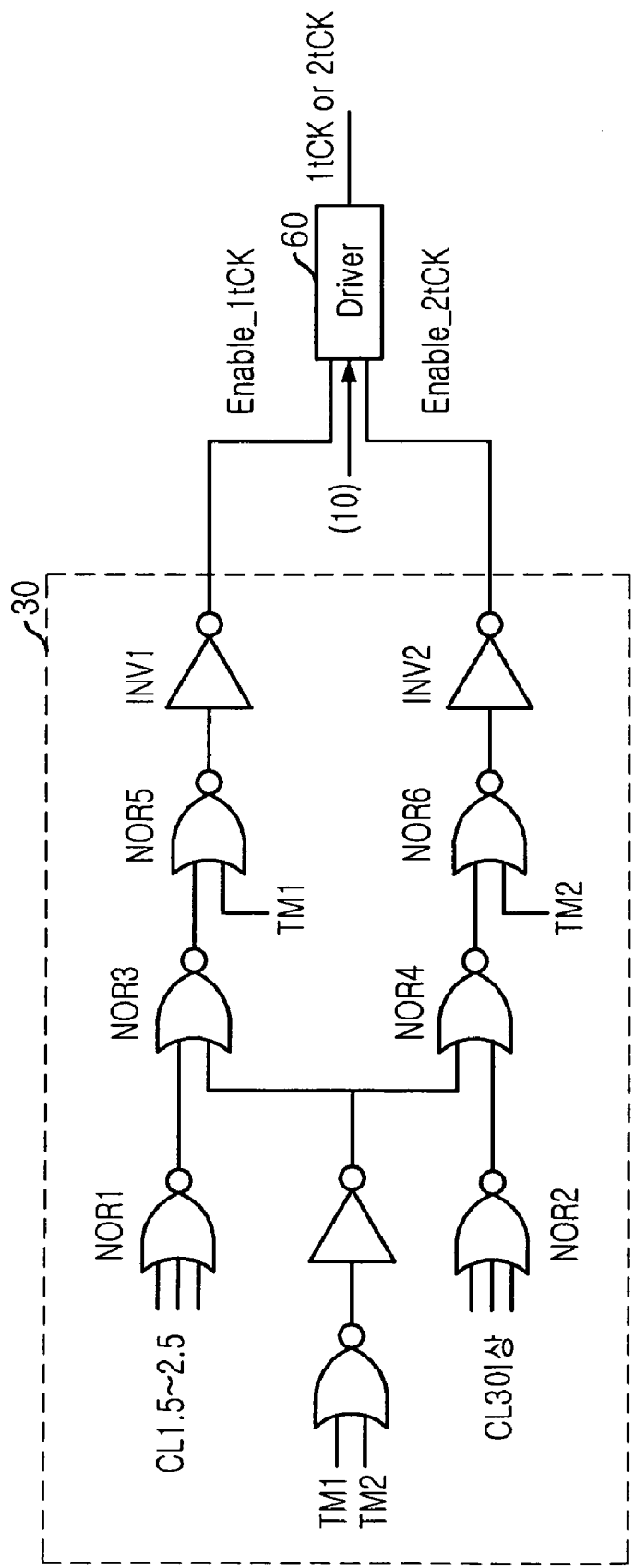
FIG. 5 is a circuit diagram of a clock divider and a peripheral circuit in accordance with a first embodiment of the present invention.

FIG. 5 is a circuit diagram of a clock divider and a peripheral circuit in accordance with a first embodiment of the present invention.

In accordance with the first embodiment of the present invention, a period of a reference clock can be changed using an external command. That is, the reference clock can be used as a 1-period based dividing clock or a 2-period based dividing clock depending on a preset CAS latency (CL). The CAS latency is the number of clocks required until a first data is outputted after a read command is inputted, and it is determined by an address command signal applied from an exterior.

Regarding the 1-period based dividing clock dvd_tCK, a clock having the same period as that of the external clock is inputted, and a first logic state is maintained during a period corresponding to one period of the external clock, while a second logic state is maintained during the remaining periods. Regarding the 2-period based dividing clock dvd__2tCK, a clock having the same period as that of the external clock is inputted, and a first logic state is maintained during a period corresponding to two periods of the external clock, while a second logic state is maintained during the remaining periods.

Figure 3:
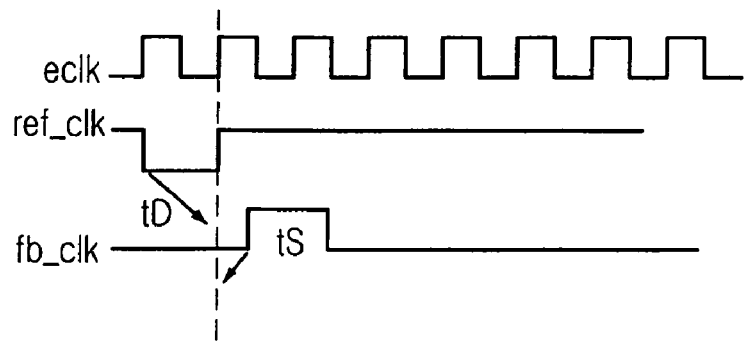
FIG. 3 is a waveform of a case where a clock is not locked due to a high operating frequency.

For example, if the CAS latency is 1.5 to 2.5, a 1-period enable clock enable_tCK is enabled so as to output the 1-period based dividing clock dvd_tCK as the reference clock. If the CAS latency is more than 3, a problem as shown in FIG. 3 may occur. Therefore, a 2-period enable clock enable__2tCK is enabled so as to output the 2-period based dividing clock dvd__2tCK as the reference clock.

Meanwhile, the 1-period enable clock enable_tCK or the 2-period enable clock enable__2tCK may be enabled using first and second test mode signals TM1 and TM2 generated according to the address command signal inputted from an exterior.

When the 1-period enable clock enable_tCK or the 2-period enable clock enable_2tCK is applied to a clock divider, an operation of the clock divider will be described below.

Figure 6:
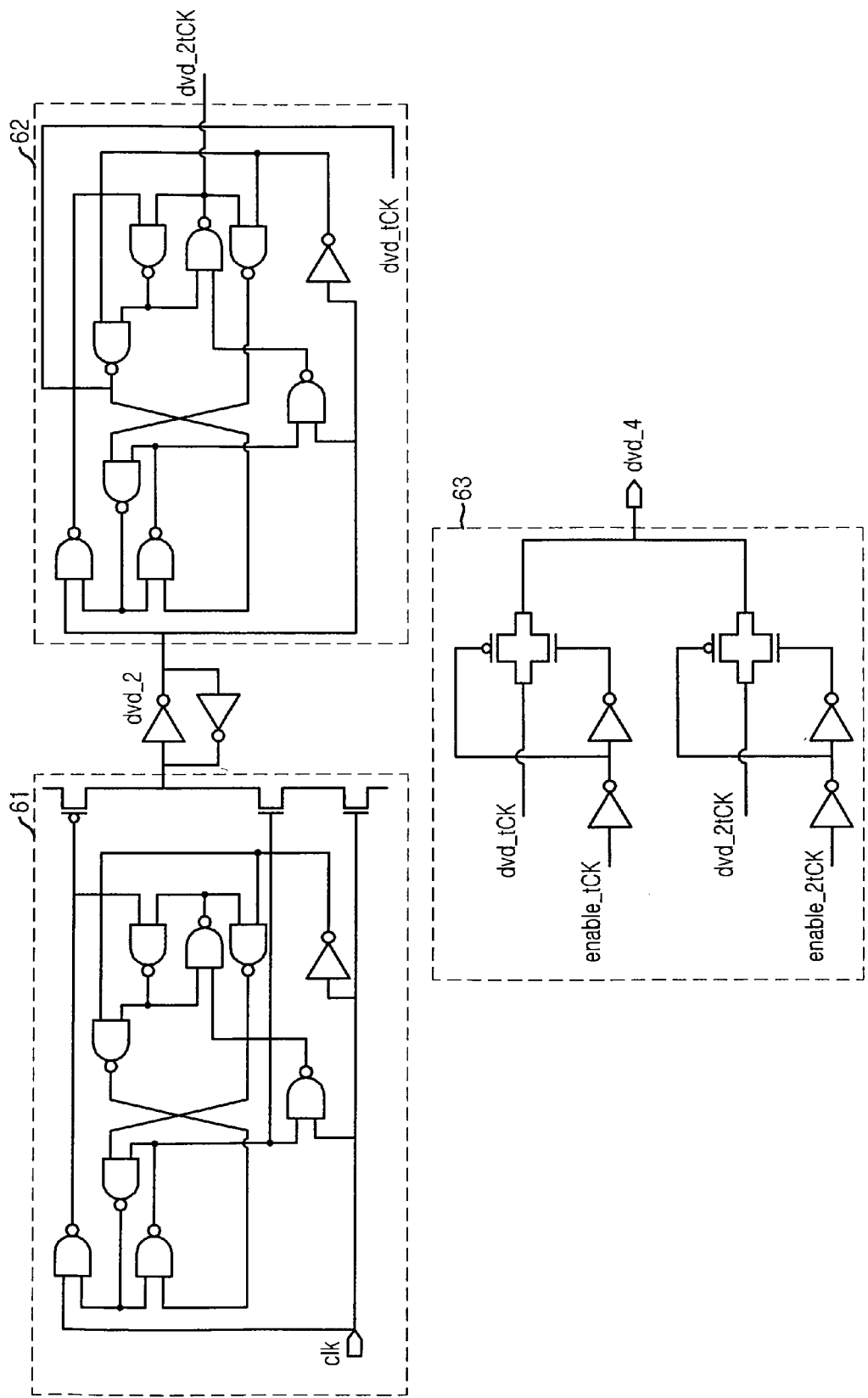
FIG. 6 is a detailed circuit diagram of the clock divider in accordance with an embodiment of the present invention.

FIG. 6 is a detailed circuit diagram of the clock divider in accordance with an embodiment of the present invention.

The clock divider 2 includes first and second division units 61 and 62, and a clock selection unit 63. When a clock from a clock buffer 10 is inputted to the first division unit 61, the first division unit 61 outputs a second division clock dvd_2, and the second division unit 62 outputs the 1-period based dividing clock dvd_tCK and the 2-period based dividing clock dvd_2tCK. If the 1-period enable clock enable_tCK is enabled, the clock selection unit 63 outputs the 1-period based dividing clock dvd_tCK as a four-division clock dvd_4. Meanwhile, if the 2-period enable clock enable_2tCK is enabled, the clock selection unit 63 outputs the 2-period based dividing clock dvd_2tCK as the four-division clock dvd_4.

Figure 7A:
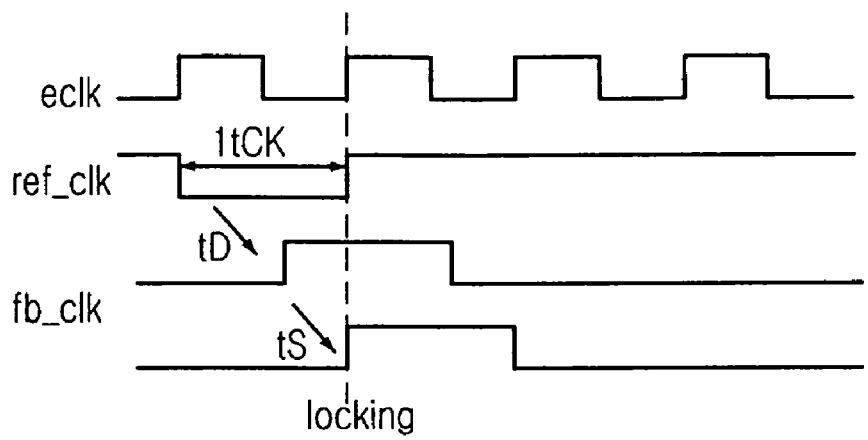
FIGS. 7a and 7b are waveforms of a phase locking in accordance with a clock division of the present invention.
Figure 7B:
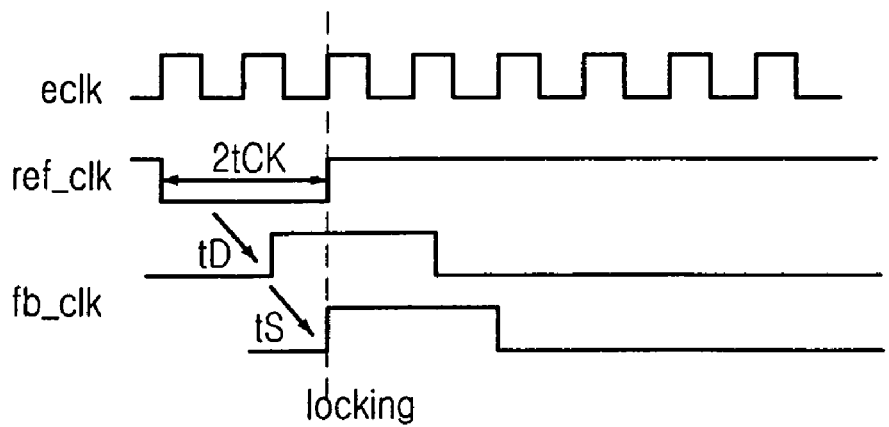

FIGS. 7A and 7B are a waveform of a phase locking in accordance with a clock division of the present invention.

Specifically, FIG. 7A is a waveform of a case where because the operating frequency is low, the clock is locked using the 1-period based dividing clock, and FIG. 7B is a waveform of a case where because the operating frequency is high, the clock is locked using the 2-period based dividing clock.

The DLL in accordance with the present invention can lock the clock without regard to the high/low operating frequency. In addition, the existing command signals can be used to change the width of the reference frequency for phase comparison. Therefore, the circuit can be simplified and thus the sufficient margin can be secured in designing the layout of the semiconductor memory device.

The present application contains subject matter related to Korean patent application No. 2004-0008447, filed in the Korean Intellectual Property Office on Oct. 2, 2004, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A delay locked loop (DLL) comprising:
   a clock buffer for receiving an external clock and buffering an internal clock;
   an enable clock generator configured to generate a 1-period enable clock or a 2-period enable clock in response to column address strobe (CAS) latency command signals generated for performing a predefined operation; and
   a clock divider configured to divide the internal clock to generate a divided clock,
   wherein the divided clock is controlled by the 1-period enable clock or the 2-period enable clock, such that the divided clock is made to be a 1-period based dividing clock or a 2-period based dividing clock,
   wherein the CAS latency command signals represent the number of clocks required until a first data is outputted after a read command is inputted, and the number is determined in response to an address command signal.

2. The DLL as recited in claim 1, further comprising:
   a test mode signal generating unit configured to generate first and second test mode signals in response to the CAS latency command signals.

3. The DLL as recited in claim 2, wherein the enable clock generator includes:
   a 1-period enable clock generating unit configured to logically combine a first group of the CAS latency command signals to generate the 1-period enable clock; and
   a 2-period enable clock generating unit configured to logically combine a second group of the CAS latency command signals to generate the 2-period enable clock, the second group of the CAS latency command signals having a value greater than the first group of the CAS latency command signals.

4. The DLL as recited in claim 3, wherein if the first test mode signal is inputted, the 1-period enable clock generating unit operates without regard to the first group of the CAS latency command signals.

5. The DLL as recited in claim 3, wherein if the second test mode signal is inputted, the 2-period enable clock generating unit operates without regard to the second group of the CAS latency command signals.

6. The DLL as recited in claim 1, wherein the clock divider includes:
   a first division unit configured to divide the internal clock outputted from the clock buffer to generate a 2-division clock;
   a second division unit configured to output a 1-period based dividing clock and a 2-period based dividing clock using the 2-division clock; and
   a clock selection unit configured to output the 1-period based dividing clock if the 1-period enable clock is enabled, and to output the 2-period based dividing clock if the 2-period based dividing clock is enabled.

7. The DLL as recited in claim 6, wherein the first division unit receives a clock having the same period as the external clock and generates the 1-period based dividing clock that maintains a first logic state during a period corresponding to one period of the external clock and maintains a second logic state during the remaining period.

8. The DLL as recited in claim 7, wherein the second division unit receives a clock having the same period as the external clock and generates the 2-period based dividing clock that maintains a first logic state during a period corresponding to two periods of the external clock and maintains a second logic state during the remaining period.

9. A delay locked loop (DLL) comprising:
   an enable clock generator configured to generate a 1-period enable clock or a 2-period enable clock in response to column address strobe (CAS) latency command signals; and
   a clock divider configured to divide an internal clock to generate a divided clock,
   wherein the divided clock is made to be a 1-period based dividing clock or a 2-period based dividing clock in response to the 1-period enable clock or the 2-period enable clock,
   wherein the CAS latency command signals represent the number of clocks required until a first data is outputted after a read command is inputted, and the number is determined in response to an address command signal.

10. The DLL as recited in claim 9, further comprising:
    a test mode signal generating unit configured to generate first and second test mode signals in response to the CAS latency command signals.

11. The DLL as recited in claim 10, wherein the enable clock generator includes:
    a 1-period enable clock generating unit configured to logically combine a first group of the CAS latency command signals to generate the 1-period enable clock; and a 2-period enable clock generating unit configured to logically combine a second group of the CAS latency command signals to generate the 2-period enable clock, wherein the second group of the CAS latency command signals has a value greater than the first group of the CAS latency command signals.

12. The DLL as recited in claim 11, wherein if the first test mode signal is inputted, the 1-period enable clock generating unit operates without regard to the first group of the CAS latency command signals.

13. The DLL as recited in claim 11, wherein if the second test mode signal is inputted, the 2-period enable clock generating unit operates without regard to the second group of the CAS latency command signals.

14. The DLL as recited in claim 9, wherein the clock divider includes:

a first division unit configured to divide the internal clock outputted from a clock buffer to generate a 2-division clock;

a second division unit configured to output a 1-period based dividing clock and a 2-period based dividing clock in response to the 2-division clock; and a clock selection unit configured to output the 1-period based dividing clock if the 1-period enable clock is enabled, and outputting the 2-period based dividing clock if the 2-period based dividing clock is enabled.

15. The DLL as recited in claim 14, wherein the first division unit receives a clock having the same period as an external clock and generates the 1-period based dividing clock that maintains a first logic state during a period corresponding to one period of the external clock and maintains a second logic state during the remaining period.

16. The DLL as recited in claim 14, wherein the second division unit receives a clock having the same period as an external clock and generates the 2-period based dividing clock that maintains a first logic state during a period corresponding to two periods of the external clock and maintains a second logic state during the remaining period.

17. A method for generating a divided clock in a delay locked loop (DLL), comprising:

receiving a clock equal to an external clock to generate an internal clock;

generating a 1-period enable clock or a 2-period enable clock in response to column address strobe (CAS) latency command signals generated for performing a predefined operation; and dividing the internal clock to generate a divided clock, the divided clock being controlled by the 1-period enable clock or the 2-period enable clock, such that the divided clock is made to be a 1-period based dividing clock or a 2-period based dividing clock, wherein the CAS latency command signals represent the number of clocks required until a first data is outputted after a read command is inputted, and the number is determined in response to an address command signal.

18. The method as recited in claim 17, wherein the receiving of the clock includes:

logically combining a first group of the CAS latency command signals to generate the 1-period enable clock; and logically combining a second group of the CAS latency command signals to generate the 2-period enable clock, the second group of the CAS latency command signals having a value greater than the first group of the CAS latency command signals.

19. The method as recited in claim 17, wherein the dividing of the internal clock includes:

dividing the internal clock to generate a 2-division clock;

outputting a 1-period based dividing clock and a 2-period based dividing clock using the 2-division clock; and outputting the 1-period based dividing clock if the 1-period enable clock is enabled, and outputting the 2-period based dividing clock if the 2-period based dividing clock is enabled.

* * * * *